United States Patent
Gooch et al.

(10) Patent No.: US 6,690,014 B1
(45) Date of Patent: Feb. 10, 2004

(54) MICROBOLOMETER AND METHOD FOR FORMING

(75) Inventors: Roland W. Gooch, Dallas, TX (US); Thomas R. Schimert, Ovilla, TX (US); William L. McCardel, Plano, TX (US); Bobbi A. Ritchey, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 09/557,748

(22) Filed: Apr. 25, 2000

(51) Int. Cl.[7] .................... H01L 31/0376; H01L 31/20
(52) U.S. Cl. .................... 250/338.4; 438/72; 438/96
(58) Field of Search .................... 250/338.4; 438/72, 438/96

(56) References Cited

U.S. PATENT DOCUMENTS

| | | | |
|---|---|---|---|
| 4,169,273 A | 9/1979 | Hendrickson | 358/213 |
| 4,291,815 A | 9/1981 | Gordon et al. | 220/200 |
| 4,352,449 A | 10/1982 | Hall et al. | 228/123 |
| 4,654,622 A | 3/1987 | Foss et al. | 338/14 |
| 4,701,424 A | 10/1987 | Mikkor | 437/209 |
| 4,752,694 A | 6/1988 | Hegal, Jr. et al. | 250/578 |
| 5,010,251 A | 4/1991 | Grinberg et al. | 250/332 |
| 5,021,663 A | 6/1991 | Hornbeck | 250/349 |
| 5,082,162 A | 1/1992 | Kamiyama et al. | 228/123 |
| 5,196,377 A | 3/1993 | Wagner et al. | 437/225 |
| 5,220,188 A | 6/1993 | Higashi et al. | 257/467 |
| 5,260,225 A | 11/1993 | Liu et al. | 437/3 |
| 5,286,671 A | 2/1994 | Kurtz et al. | 437/64 |
| 5,286,976 A | 2/1994 | Cole | 250/349 |
| 5,288,649 A | 2/1994 | Keenan | 437/3 |
| 5,300,915 A | 4/1994 | Higashi et al. | 338/22 R |
| 5,367,167 A | 11/1994 | Keenan | 250/338.4 |
| 5,367,194 A | 11/1994 | Beatty | 257/727 |
| 5,431,328 A | 7/1995 | Chang et al. | 228/180.22 |
| 5,449,910 A | 9/1995 | Wood et al. | 250/338.1 |
| 5,450,053 A | 9/1995 | Wood | 338/18 |
| 5,455,421 A | 10/1995 | Spears | 250/338.4 |
| 5,512,748 A | 4/1996 | Hanson | 250/332 |

(List continued on next page.)

FOREIGN PATENT DOCUMENTS

| | | | | |
|---|---|---|---|---|
| EP | 0 828 346 A2 | * | 3/1998 | H03H/9/05 |
| EP | 0 951 069 A1 | * | 10/1999 | H01L/23/10 |
| FR | 2 780 200 | * | 12/1999 | H01L/23/10 |
| FR | WO 99/67818 | | 12/1999 | H01L/21/50 |
| WO | WO 99/50905 | * | 10/1999 | H01L/23/10 |

OTHER PUBLICATIONS

Tissot, Jean–Luc, et al, Abstract: *LETI/LIR's Amorphous Silicon Uncooled Microbolometer Development*, Part of the SPIE Conference on Infrared Detectors and Focal Plane Arrays V, Orlando, Florida, SPIE vol. 3379, Apr. 1998, pp. 139–144, Apr. 1998.

"Infrared Detector with Amorphous Silicon Detector Elements, and a Method of Making It", U.S. patent application Ser. No. 09/844, 171 filed Apr. 25, 2001, inventors Thomas R. Schimert, et al, 34 pages of Specification, Claims and Abstract, 7 pages of drawings, Apr. 25, 2001.

Primary Examiner—Constantine Hannaher
(74) Attorney, Agent, or Firm—Baker Botts L.L.P.

(57) ABSTRACT

A microbolometer is provided that includes an absorber element having material properties to change temperature in response to absorbing infrared radiation. An amorphous silicon detector is thermally coupled to the absorber element and is suspended above a silicon substrate at a height of one-quarter wavelength of the infrared radiation to be detected. The amorphous silicon detector changes electrical resistance in response to the absorber element changing temperature. The microbolometer also includes electrode arms coupled to the silicon substrate to provide structural support for the amorphous silicon detector above the surface of the silicon substrate. The electrode arms further provide electrical connectivity for the microbolometer.

38 Claims, 9 Drawing Sheets

U.S. PATENT DOCUMENTS

| | | | |
|---|---|---|---|
| 5,534,111 A | 7/1996 | Hocker et al. | 216/15 |
| 5,539,206 A | 7/1996 | Schimert | 250/338.4 |
| 5,573,859 A | 11/1996 | Suppelsa | 428/553 |
| 5,589,688 A | 12/1996 | Kimura et al. | 250/338.4 |
| 5,605,489 A | 2/1997 | Gale et al. | 451/28 |
| 5,659,195 A | 8/1997 | Kaiser et al. | 257/415 |
| 5,701,008 A | 12/1997 | Ray et al. | 250/352 |
| 5,726,480 A | 3/1998 | Pister et al. | 257/415 |
| 5,760,398 A | 6/1998 | Blackwell et al. | 250/332 |
| 5,773,987 A | 6/1998 | Montoya | 324/757 |
| 5,777,328 A | 7/1998 | Gooch | 250/338.4 |
| 5,789,753 A | 8/1998 | Gooch et al. | 250/349 |
| 5,825,029 A | 10/1998 | Agnese et al. | 250/338.1 |
| 5,895,233 A | 4/1999 | Higashi et al. | 438/107 |
| 5,905,007 A | 5/1999 | Ho et al. | 430/22 |
| 5,912,464 A | 6/1999 | Vilain et al. | 250/338.4 |
| 5,915,168 A | 6/1999 | Salatino et al. | 438/110 |
| 5,919,548 A | 7/1999 | Barron et al. | 428/138 |
| 5,921,461 A | 7/1999 | Kennedy et al. | 228/124.6 |
| 5,923,995 A | 7/1999 | Kao et al. | 438/460 |
| 5,929,441 A | 7/1999 | Beratan et al. | 250/338.3 |
| 5,945,673 A | 8/1999 | Beratan et al. | 250/338.3 |
| 5,970,315 A | 10/1999 | Carley et al. | 438/52 |
| 6,028,312 A | 2/2000 | Wadsworth et al. | 250/351 |
| 6,036,872 A | 3/2000 | Wood et al. | 216/2 |
| 6,046,067 A | 4/2000 | Werner | 438/52 |
| 6,054,745 A | 4/2000 | Nakos et al. | 257/415 |
| 6,062,461 A | 5/2000 | Sparks et al. | 228/123.1 |
| 6,064,216 A | 5/2000 | Farnworth et al. | 324/755 |
| 6,087,199 A | 7/2000 | Pogge et al. | 438/106 |
| 6,100,525 A | 8/2000 | Eden | 250/338.1 |
| 6,111,254 A | 8/2000 | Eden | 250/338.1 |
| 6,114,696 A | 9/2000 | Eden | 250/338.1 |
| 6,114,697 A | 9/2000 | Eden et al. | 250/338.1 |
| 6,119,920 A | 9/2000 | Guthrie et al. | 228/123.1 |
| 6,133,570 A | 10/2000 | Schimert et al. | 250/338.1 |
| 6,143,997 A | 11/2000 | Feng et al. | 200/181 |
| 6,159,812 A | 12/2000 | Cheek et al. | 438/303 |
| 6,210,988 B1 | 4/2001 | Howe et al. | 438/50 |
| 6,232,150 B1 | 5/2001 | Lin et al. | 438/119 |
| 6,392,332 B1 | 5/2002 | Gooch et al. | 250/332 |

\* cited by examiner

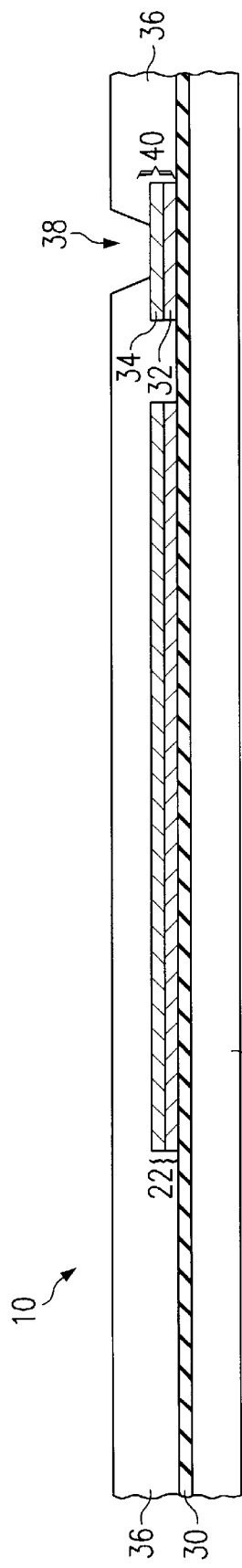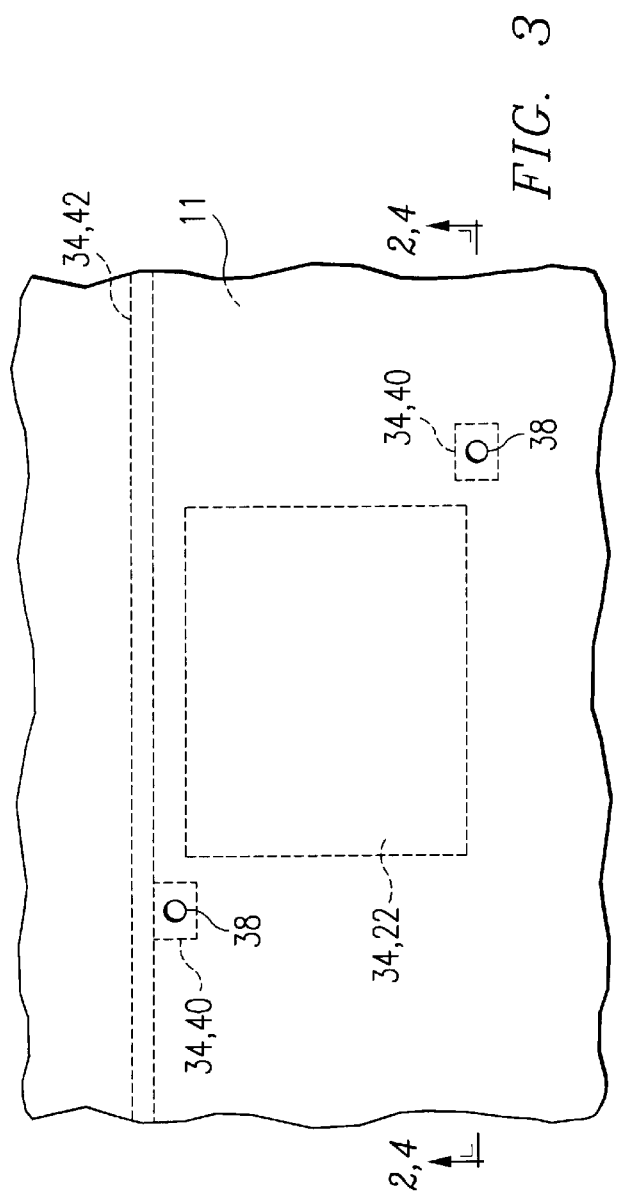

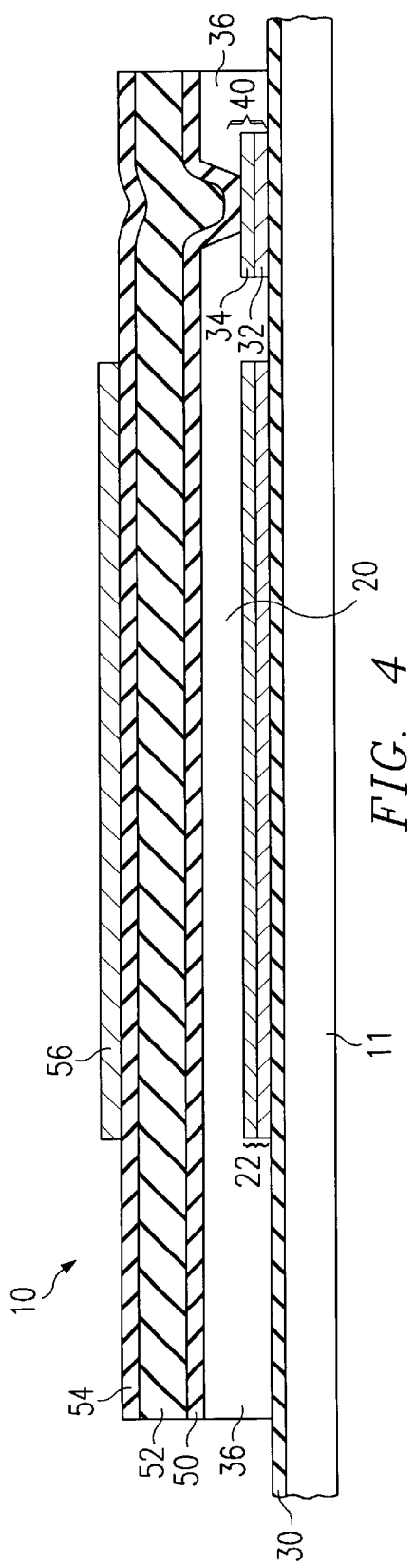
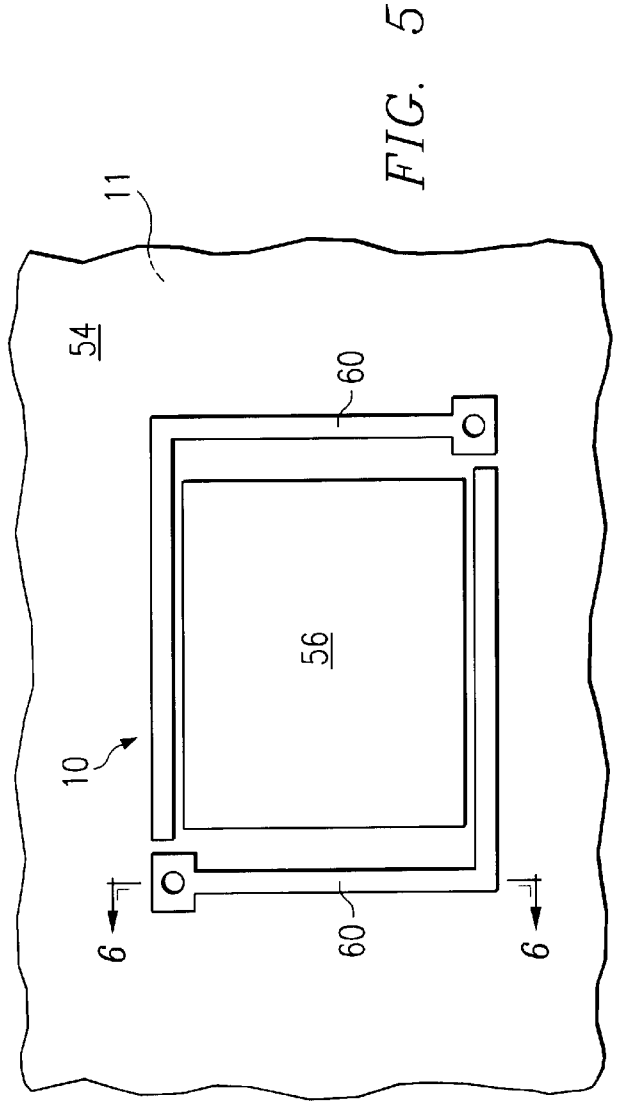

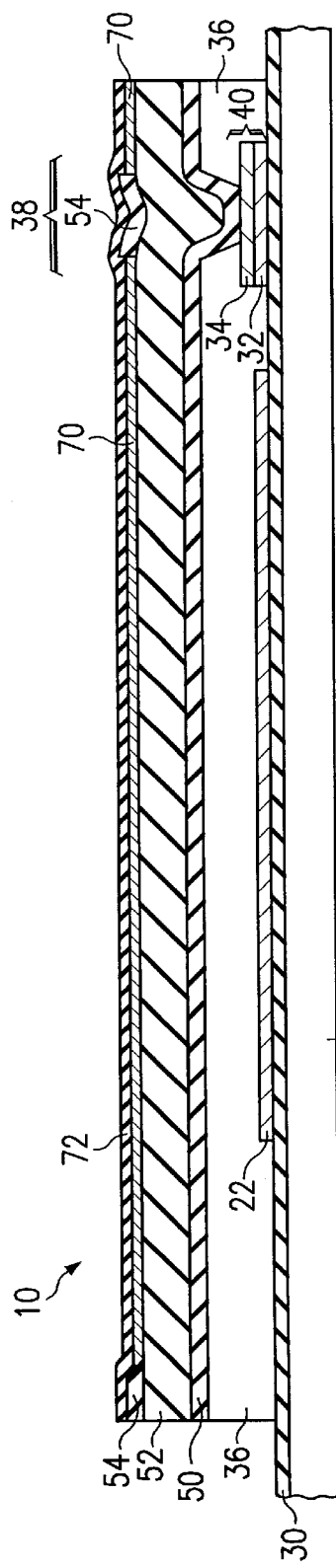
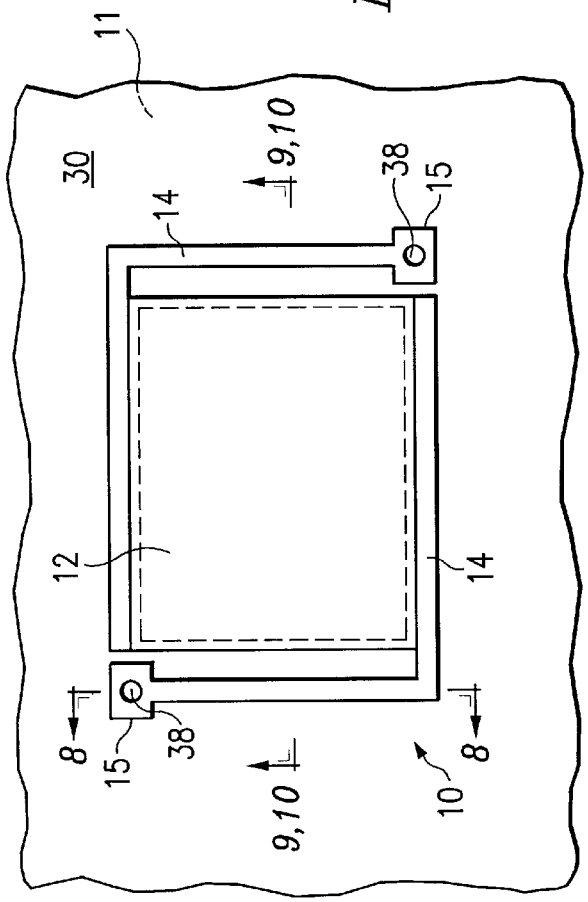

MICROBOLOMETER AND METHOD FOR FORMING

TECHNICAL FIELD OF THE INVENTION

This invention relates in general to infrared detectors and more particularly to a microbolometer and the method for forming the same.

BACKGROUND OF THE INVENTION

Infrared (IR) detectors are often utilized to detect fires, overheating machinery, planes, vehicles, people, and any other objects that emit thermal radiation. Infrared detectors are unaffected by ambient light conditions or particulate matter in the air such as smoke or fog. Thus, infrared detectors have potential use in night vision and when poor vision conditions exist, such as when normal vision is obscured by smoke or fog. IR detectors are also used in non-imaging applications such as radiometers, gas detectors, and other IR sensors.

Infrared detectors generally operate by detecting the differences in thermal radiance of various objects in a scene. That difference is converted into an electrical signal which is then processed. Microbolometers are infrared radiation detectors that are fabricated on a substrate material using traditional integrated circuit fabrication techniques. After fabrication, microbolometers are generally placed in vacuum packages to provide an optimal environment for the sensing device. Conventional microbolometers measure the change in resistance of a detector element after the microbolometer is exposed to thermal radiation. Microbolometers have applications in gas detectors, night vision, and many other situations.

The primary factors affecting response time and sensitivity of microbolometers are thermal mass and thermal isolation. Microbolometer response time is the time necessary for a detector element to absorb sufficient infrared radiation to alter an electrical property, such as resistance, of the detector element and to dissipate the heat resulting from the absorption of the infrared radiation. Microbolometer sensitivity is determined by the amount of infrared radiation required to cause a sufficient change in an electrical property of the microbolometer detector. Microbolometer response time is inversely proportional to both thermal mass and thermal isolation. Thus, as thermal mass increases, response time becomes slower since more infrared energy is needed to sufficiently heat the additional thermal mass in order to obtain a measurable change in an electrical property of the microbolometer detector element. As thermal isolation increases, response time becomes slower since a longer period of time is necessary to dissipate the heat resulting from the absorption of the infrared radiation. Microbolometer operating frequency is inversely proportional to response time. However, microbolometer sensitivity is proportional to thermal isolation. Therefore, if a specific application requires high sensitivity and does not require high operating frequency, the microbolometer would have maximum thermal isolation and minimal thermal mass. If an application requires a higher operating frequency, a faster microbolometer may be obtained by reducing the thermal isolation which will also result in a reduction in sensitivity.

In order to maximize the sensitivity of microbolometers, the temperature coefficient of resistance of the detector element in the microbolometer should be as high as possible.

SUMMARY OF THE INVENTION

From the foregoing, it may be appreciated that a need has arisen for an improved microbolometer and method for forming the same. In accordance with the present invention, a microbolometer and method for forming the same is provided which substantially eliminates or reduces the disadvantages and problems associated with conventional micro infrared detectors.

According to one embodiment of the present invention, there is provided a microbolometer and method for forming comprising an absorber element that changes temperature in response to absorbing infrared radiation and an amorphous silicon detector suspended above a silicon substrate at a height of one-quarter wave length of the infrared radiation to be detected. The amorphous silicon detector changes electrical resistance in response to the absorber element changing temperatures. The microbolometer further comprises electrode arms coupled to the silicon substrate providing structural support for the amorphous silicon detector and electrical connectivity for the microbolometer.

The technical advantages of the present invention include providing a microbolometer of substantially lower thermal mass than conventional microbolometers. The substantially lower thermal mass results in increased operating frequency and increased thermal isolation for the microbolometer. The increased thermal isolation results in increased sensitivity such that less infrared radiation is required to cause a detectable change in the electrical resistance of the microbolometer detector. Another technical advantage of the present invention includes a thermal shunt that may be varied during fabrication to obtain microbolometers with differing operating frequency and sensitivity characteristics. By increasing the thermal shunt material, the thermal coupling between the microbolometer and the substrate material is increased and the thermal isolation of the microbolometer is correspondingly decreased. This results in a microbolometer with an increased operating frequency and decreased sensitivity. Yet another technical advantage of the present invention is the use of spiral arms to minimize the area required for a given electrode arm length thereby maximizing the area available for the microbolometer detector element.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings:

FIG. 2 is a cross-section illustration of a partially formed microbolometer of the present invention;

FIG. 3 is a diagram illustrating the partially fabricated microbolometer after completing the steps illustrated in FIG. 2;

FIG. 4 is a cross-section illustration of a method of forming the microbolometer of the present invention;

FIG. 5 is a diagram illustrating a partially fabricated microbolometer after completion of the steps illustrated in FIG. 4;

FIG. 6 is a cross-section illustration of a method of forming the microbolometer of the present invention;

FIG. 7 is a diagram illustrating the microbolometer of the present invention after etching to define a final form of the microbolometer;

DETAILED DESCRIPTION OF THE INVENTION

Figure 1:
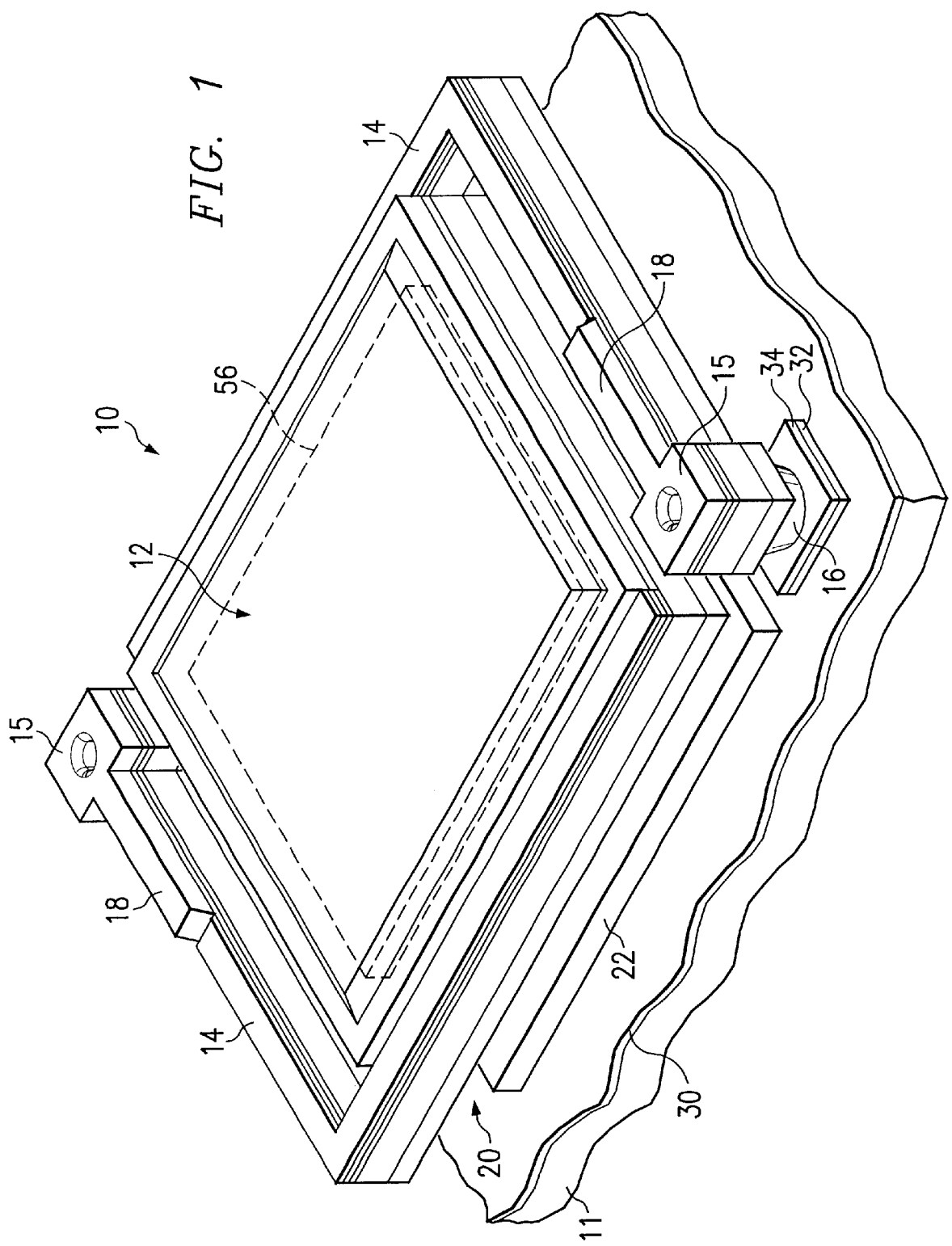
FIG. 1 is a perspective of a microbolometer formed in accordance with the present invention.

FIG. 1 illustrates a microbolometer 10 in accordance with one embodiment of the present invention. In this embodiment, microbolometer 10 is formed on a substrate 11.

Substrate 11 typically is any suitable substrate material including a monocrystalline silicon wafer or a silicon wafer containing a readout integrated circuit. Microbolometer 10 is a sensor that is operable to detect infrared radiation.

Referring to FIG. 1, microbolometer 10 includes electrode arms 14 coupled to a detector 12. Infrared radiation sensed by the detector 12 results in a measurable change in the resistance of the material comprising the detector. Detector 12 is suspended over the surface of substrate 11 by electrode arms 14. Construction of the detector 12 is in several layers of various materials discussed in detail below. Electrode arms 14 are coupled along one side of detector 12 and proceed unattached along a second, adjacent side to an electrode terminal end 15. A post 16 is coupled to the electrode terminal end 15 of electrode arm 14. Post 16 provides structural support and electrical connection for microbolometer 10. Electrical circuitry connected to electrode terminal ends 15 provides a constant voltage across the electrode arms 14 and senses a change in electrical current flowing through detector 12. The magnitude of the change in electrical current varies with the amount of infrared radiation detected. In an alternate embodiment, the electrical circuitry provides a constant electrical current flowing through detector 12 and senses a change in the voltage across electrode arms 14. The thermal mass of microbolometer 10 affects the thermal isolation, response time, operating frequency, and sensitivity. By fabricating a microbolometer with minimal thermal mass, high sensitivity and high operating frequency can be realized. Thermal isolation of microbolometer 10 from substrate 11 also affects the operating frequency and sensitivity. Thermal isolation of detector 12 from substrate 11 increases the sensitivity of microbolometer 10 since less infrared radiation energy is necessary to raise the temperature of detector 12. Thermal isolation also affects the operating frequency and response time of microbolometer 10 since it affects the cooling rate of detector 12. An increase in thermal isolation results in a corresponding decrease in cooling rate of detector 12 and, thus, a corresponding decrease in operating frequency of microbolometer 10.

By modifying a single step in the fabrication of microbolometer 10, a thermal shunt 18 is placed on electrode arms 14 coupled to posts 16 to decrease the thermal isolation of microbolometer 10. Placing a thermal shunt 18 on electrode arm 14 will increase the operating frequency of microbolometer 10 since the cooling rate of detector 12 is increased. Thermal shunt 18 on electrode arms 14 also results in decreased sensitivity since more thermal coupling between detector 12 and substrate 11 exists. Thus, an increased amount of infrared radiation energy is necessary to increase the temperature of detector 12 resulting in a corresponding change in the electrical resistance of the detector. By varying the length of thermal shunt 18, and thus the amount of thermal shunt material deposited on electrode arms 14, a microbolometer 10 with differing operating frequency and sensitivity characteristics can be fabricated.

Beneath detector 12 is an antireflective structure and resonant cavity 20. Antireflective structure 20 functions to minimize the amount of infrared radiation unabsorbed by detector 12. Detector 12 is suspended above the surface of substrate 11 at a height of approximately one-quarter wavelength of the infrared radiation to be detected by microbolometer 10. The one-quarter wavelength height causes infrared energy waves unabsorbed by detector 12 to be reflected by reflector 22 and trapped in antireflective structure 20 until the infrared radiation is absorbed by detector 12. Antireflective structure 20 creates a more efficient microbolometer 10 since the amount of infrared radiation absorbed by detector 12 is maximized.

Referring to FIG. 2, semiconductor substrate or integrated circuit 11 provides the base for the formation of microbolometer 10. A silicon dioxide layer 30 is formed on substrate 11. A thin layer of titanium 32 is next formed on silicon dioxide layer 30 followed by a thin layer of aluminum 34. Aluminum layer 34 and titanium layer 32 are patterned using a photoresist and etch process to form connection pads 40 for providing electrical connections to other electrical circuitry for microbolometer 10. In addition, aluminum layer 34 and titanium layer 32 are patterned to form reflector 22 for providing a reflective surface within antireflective structure and the resonant cavity 20 as shown in FIG. 1. In a preferred embodiment, microbolometer 10 is formed as a part of a readout integrated circuit. One connection pad 40 of microbolometer 10 passes through the surface dielectric layer of the substrate 11 to make contact with the underlying electrical circuitry. The other connection pad 40 of microbolometer 10 is coupled to a common bus formed from the aluminum layer 34 on the surface of substrate 11. FIG. 3 illustrates in part aluminum layer 34 after patterning by the photoresist and etch technique.

A polyimide layer 36 is deposited over the entire structure to a depth on the order of one-quarter wavelength of the infrared radiation to be detected. A one-quarter wavelength depth provides the proper spacing between reflector 22 of antireflective structure 20 and the bottom surface of detector 12. The polyimide 36 is an organic material. Openings are etched in polyimide layer 36 to expose aluminum connection pads 40 to define post receptors 38. Post receptors 38 are holes in electrode terminal ends 15 that will eventually contain an aluminum post providing structural support and electrical connections for microbolometer 10. Post receptors 38 are preferably formed using a photoresist and etch technique. FIG. 3 illustrates in part the location of post receptors 38.

Referring to FIG. 4, a first low stress dielectric film 50 is formed on the surface of the existing structure to a depth on the order of 250 Å. First low stress dielectric film 50 is preferably a silicon nitride material but may be any suitable dielectric material. An amorphous silicon layer 52 is next formed on the surface of the structure to a depth on the order of 500–1,000 Å. Amorphous silicon layer 52 forms the detector element layer of detector 12 and is resistive. Amorphous silicon layer 52 is doped with boron during deposition in order to obtain a resistive layer to function as the detector element in microbolometer 10. The deposition preferably takes place at a temperature just below that which will degrade polyimide layer 36. A second low stress dielectric film 54 is deposited on amorphous silicon layer 52 to a depth on the order of approximately 250 Å.

Since amorphous silicon layer 52 is transparent to infrared radiation, a material sensitive to infrared radiation is used to thermally transfer energy absorbed from the infrared radiation. A thin metal absorber film 56 is deposited on second low stress dielectric film 54 to a depth on the order of 50–150 Å. Thin metal absorber film 56 is preferably titanium but may be any suitable material that will absorb infrared radiation. Thin metal absorber film 56 is patterned to leave an absorber area on detector 12. Absorber 56 is preferably patterned using a photoresist and etch technique, or other available techniques such as by a photoresist liftoff method. FIG. 5 illustrates in part the location of absorber 56 in relation to the structure of microbolometer 10. Absorber 56 absorbs heat from infrared radiation and transfers the heat to amorphous silicon layer 52. Although second low stress dielectric film 54 provides electrical insulation for amorphous silicon layer 52, it does not thermally isolate amorphous silicon layer 52 from absorber 56. Thus, amorphous silicon layer 52 is thermally coupled to absorber 56 resulting in the transfer of thermal energy from absorber 56 to amorphous silicon layer 52. As amorphous silicon layer 52 increases in temperature, the electrical resistance of amorphous silicon layer 52 changes. The change in electrical resistance is measured and processed to yield a quantity of infrared radiation present in the detection area. Any infrared radiant energy not absorbed by absorber 56 passes through the structure, reflects off reflector 22, and becomes trapped in antireflective structure 20 such that absorber 56 absorbs the trapped infrared radiant energy. Therefore, absorber 56 absorbs infrared radiant energy both as it passes through detector 12 and after it becomes trapped in antireflective structure 20.

Referring to FIG. 5, absorber 56 is shown in relation to microbolometer 10 formed on substrate 11. The outer surface of second low stress dielectric film 54 is patterned and openings are etched to expose portions of the outer surface of amorphous silicon layer 52 to define electrode arm channels 60. The second low stress dielectric film layer 54 is preferably patterned and etched using a photoresist and etch technique.

Referring to FIG. 6, a thin electrode metal layer 70 is deposited in electrode arm channels 60 to a depth of approximately 200 Å. Electrode metal layer 70 is preferably titanium or nickel and is preferably deposited using a photoresist and lift-off technique. Electrode metal layer 70 is in direct contact with amorphous silicon layer 52 to provide a low resistance electrical connection between the detector element of detector 12 (i.e., amorphous silicon layer 52) and electrical circuitry to measure the change in resistance of detector 12 in response to absorbing infrared radiation. A third low stress dielectric film 72 is deposited on the surface of the structure to a depth of approximately 100 Å in order to provide a final layer of protection for microbolometer 10.

In an alternate embodiment of the process for fabricating microbolometer 10, the deposition of a thin metal absorber film 56 forms both absorber 56 and electrode metal layer 70. In the alternate embodiment after second low stress dielectric film 54 is deposited, the outer surface of second low stress dielectric film 54 is patterned and openings are etched to expose portions of the outer surface of amorphous silicon layer 52 to define electrode arm channels 60 using a photoresist and etch technique. Thin metal absorber film 56 is deposited over the structure to a depth on the order of 50–150 angstroms. Thin metal absorber film 56 is patterned using a photoresist and etch technique to leave absorber 56 and electrode metal layer 70. The process of the alternate embodiment eliminates a separate step for deposition of electrode metal layer 70.

Referring to FIG. 7, a photoresist and etch technique is used to pattern the structure to form microbolometer 10. The areas surrounding microbolometer 10 are etched down to the polyimide layer 36 and post receptors 38 are etched down to the aluminum layer 34. At this point, microbolometer 10 includes several layers of material stacked on top of a polyimide layer 36. Polyimide layer 36 will be removed in a later step to create a space between substrate 11 and both detector 12 and electrode arms 14. In order to support detector 12 and electrode arms 14 above the surface of substrate 12, posts are formed in post receptors 38 to provide both structural support and electrical connections for microbolometer 10. Post receptors 38 are formed in electrode terminal ends 15 by removing the previously deposited layers of first low stress dielectric film 50, amorphous silicon layer 52, second low stress dielectric film 54, and third low stress dielectric film 72 thereby exposing connection pads 40. Post receptors 38 are preferably formed using a photoresist and etch technique simultaneously with defining the bolometer 10. The base layer of post receptor 38 is connection pad 40 and the top layers of post receptor 38 is electrode metal layer 70. Therefore, an electrically conductive material may be used to electrically couple electrode arms 14 with connection pads 40.

In an alternate embodiment of the process for fabrication of microbolometer 10, post receptors 38 are not etched in polyimide layer 36 immediately after polyimide layer 36 is formed. In addition, the photoresist and etch step to form the structure of microbolometer 10 does not etch and reform post receptors 38. Instead, a separate photoresist and etch step is added to remove all layers above connection pads 40.

Figure 8:
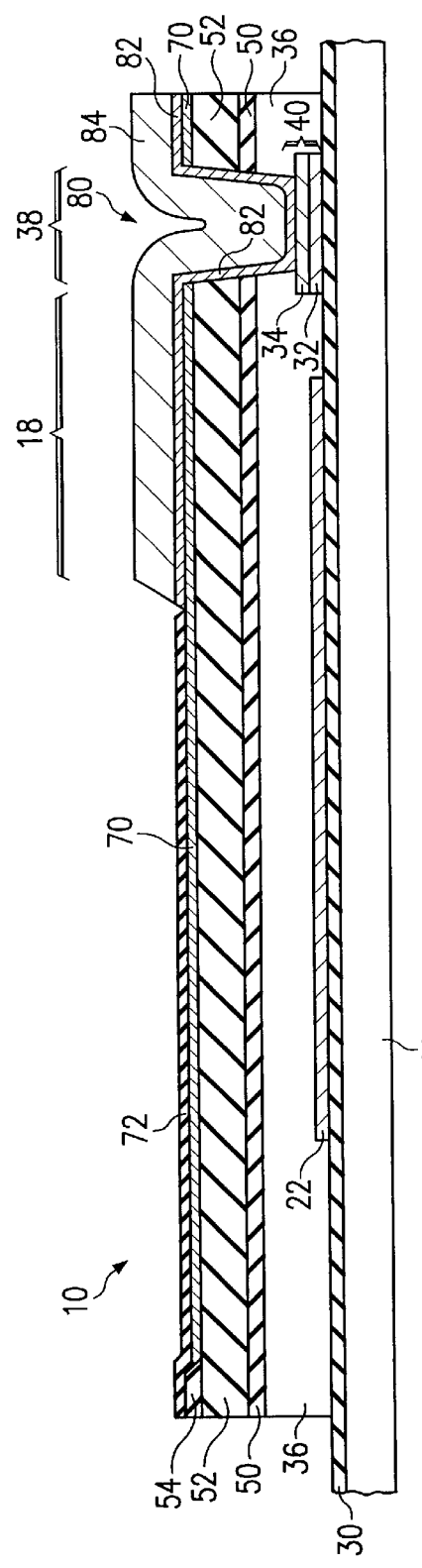
FIG. 8 is a cross-section diagram illustrating deposition of a post and thermal shunting device.

Referring to FIG. 8, third low stress dielectric film 72 is removed from electrode arms 14 in the area to receive a post 80 and thermal shunt 18. Third low stress dielectric film 72 is preferably removed using a photoresist and etch technique to expose electrode metal layer 70. A thin layer of titanium 82 and a thick layer of aluminum 84 are deposited in post receptor 38 and on electrode terminal end 15. The titanium layer 82 and the aluminum layer 84 are deposited in sequence and patterned at the same time by a liftoff or by an etching technique. Titanium layer 82 and aluminum layer 84 also form thermal shunt 18 on electrode arm 14. The titanium layer 82 is preferably deposited to a depth of 1,000 Å and the aluminum layer is preferably 10,000 to 30,000 Å thick. Post 80 and thermal shunt 18 comprise titanium layer 82 and aluminum layer 84 deposited in and around post receptor 38. Titanium layer 82 and aluminum layer 84 comprising post 80 are preferably deposited using a sputtered film process and patterned using a etching technique or a photoresist and lift off technique. Although post 80 is described as comprising titanium and aluminum layers, any suitable metal, metal layers, or metal alloys may be used such as nickel in combination with titanium and aluminum. Post 80 provides both structural support for microbolometer 10 by suspending detector 12 above the surface of substrate 11 and electrical connection between electrode arm 14 and connection pads 40. Post 80 is formed in electrode terminal ends 15. Therefore, in a preferred embodiment, each microbolometer 10 will have two posts 80, one on each of two opposite corners.

In addition to providing structural support and electrical connections for microbolometer 10, posts 80 also provide thermal shunting for microbolometer 10. By increasing the length of thermal shunt 18 over electrode metal layer 70, the thermal isolation of microbolometer 10 is reduced. This results in a microbolometer with increased operating frequency and decreased sensitivity as previously described.

Figure 9:
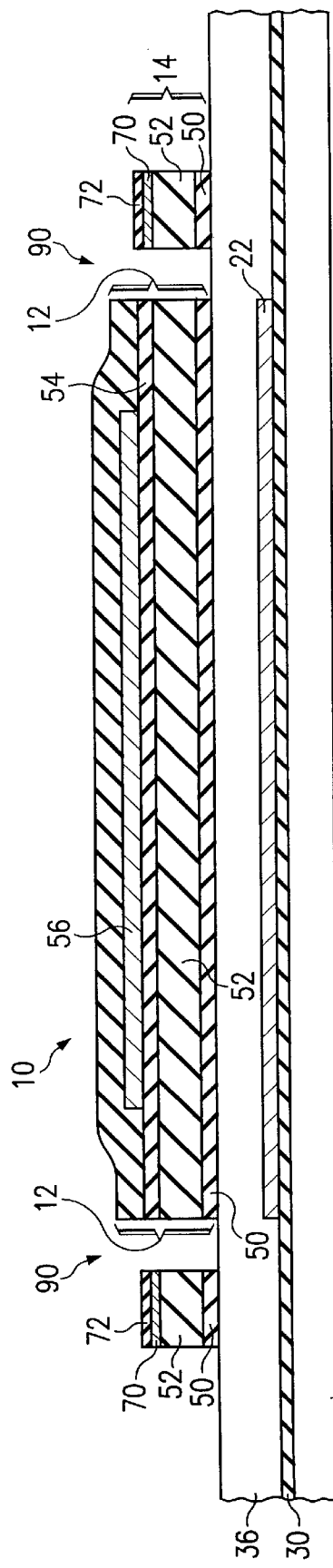
FIG. 9 is a cross-section schematic illustration of the microbolometer of the present invention prior to removal of a polyimide layer.

Referring to FIG. 9, a cross-section of microbolometer 10 is shown. Electrode arm gaps 90 illustrate that all layers above polyimide layer 36 have been removed in the areas where there is no microbolometer 10 structure.

Figure 10:
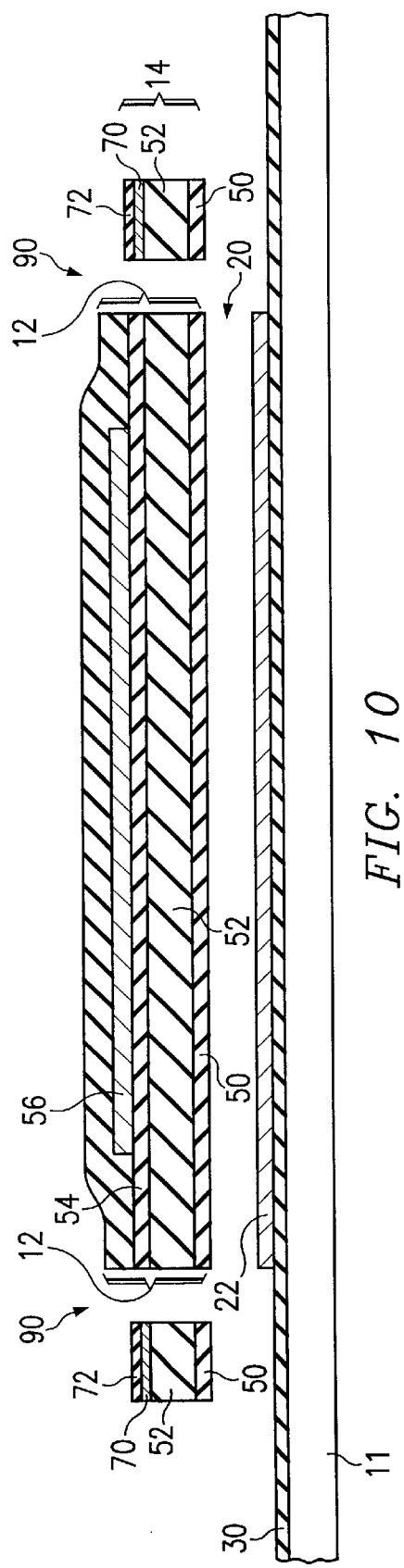
FIG. 10 is a cross-section illustration of the completed microbolometer of the present invention.

Referring to FIG. 10, polyimide layer 36 is removed by exposing the structure to an oxygen plasma dry etch. The byproduct of this etching process is carbon dioxide eliminating the need to specially dispose of the byproduct of etching.

Figure 13A:
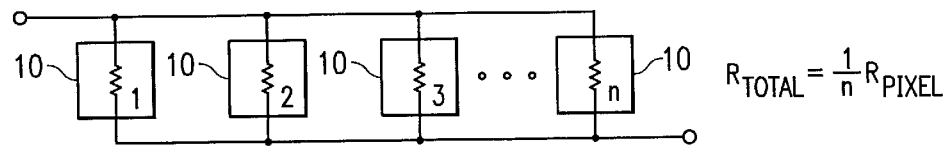
FIG. 13A is an illustration of a configuration of microbolometers in accordance with the present invention wherein non-imaging pixels are connected electrically in parallel.
Figure 14A:
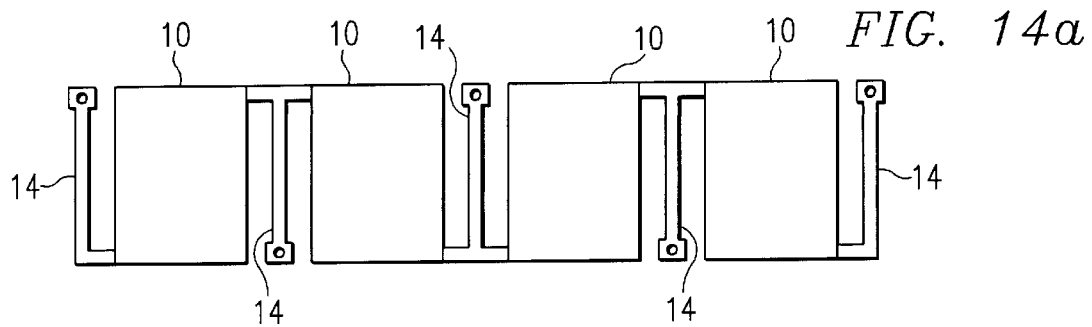
FIG. 14A is a schematic illustration of a linear non-imaging pixel array with shared electrode arms for adjacent microbolometers of the present invention.

Referring to FIG. 13A and FIG. 14A several microbolometers 10 may be formed on a substrate in an electrically parallel microbolometer array structure to produce a large non-imaging microbolometer with less inherent noise, as the noise figure is reduced by the square root of the number of pixels electrically in parallel. As illustrated in FIG. 14A, the parallel electrode arms of the microbolometer array structure are shared between two adjacent microbolometers. The sharing of electrode arms results in more thermal isolation and, thus, less thermal coupling to the substrate. This results in a more sensitive bolometer. The parallel microbolometer array structure may be formed without adjacent microbolometers sharing electrode arms. The result is less thermal isolation and, thus, a higher operating frequency as compared to microbolometer array structures with shared electrode arms. The corners of adjacent microbolometers 10 in large non-imaging microbolometer arrays are at an equipotential and may be connected together to form a more rigid microbolometer array structure. A more rigid microbolometer array structure results in a microbolometer array more tolerant to stress.

Figure 13B:
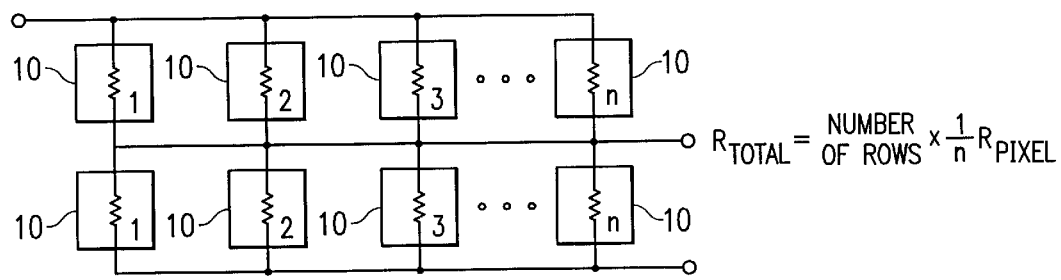
FIG. 13B illustrates an array of microbolometers in accordance with the present invention wherein non-imaging pixels are connected in an electrically series-parallel circuit.

Referring to FIG. 13A the electrically parallel array embodiment provides a technical advantage for parallel groups of long narrow detector lines, such as for a spectrometer. The electrically series-parallel configuration of FIG. 13B is useful and provides technical advantages for large rectangular arrays of detectors functioning as a single detector.

Several microbolometers 10 may be formed and placed in a single vacuum package to form a pixel array structure for thermal imaging. In this embodiment, the microbolometers 10 are discrete devices detecting thermal energy in a specific portion of a target (scene) area.

In the thermal imaging array embodiment, select microbolometers within the microbolometer array structure may have an infrared shield deposited on the upper surface of the microbolometer and/or the thermal shunt 18 may be extended to the detector 12 to provide reference detectors that are non-responsive to incident radiation. These infrared shield depositions provide an ambient temperature reference resistance for comparison with the resistance of the detector pixel. These reference pixels are thermally isolated from the substrate and therefore respond to the joule heating by bias current as do the detector pixels.

Figure 11:
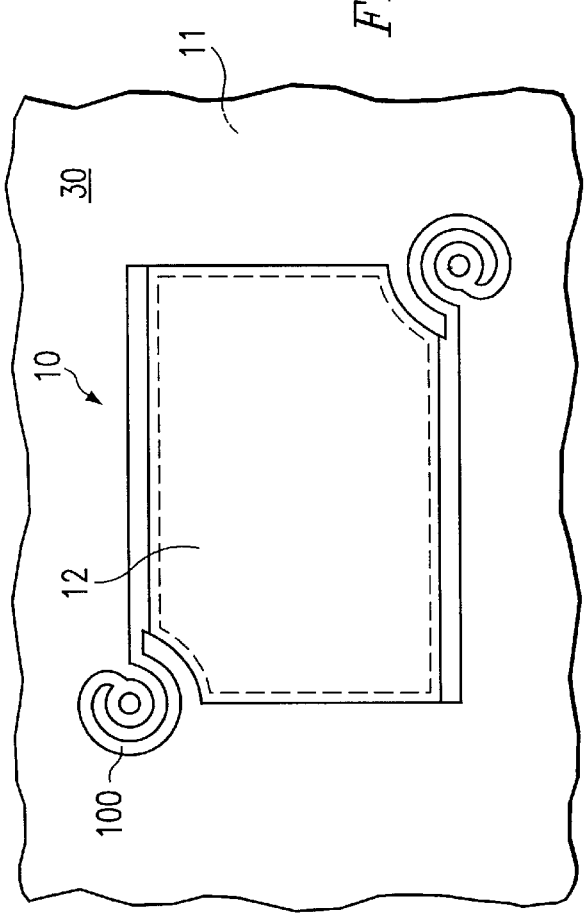
FIG. 11 is an illustration of a microbolometer with spiral legs.
Figure 14B:
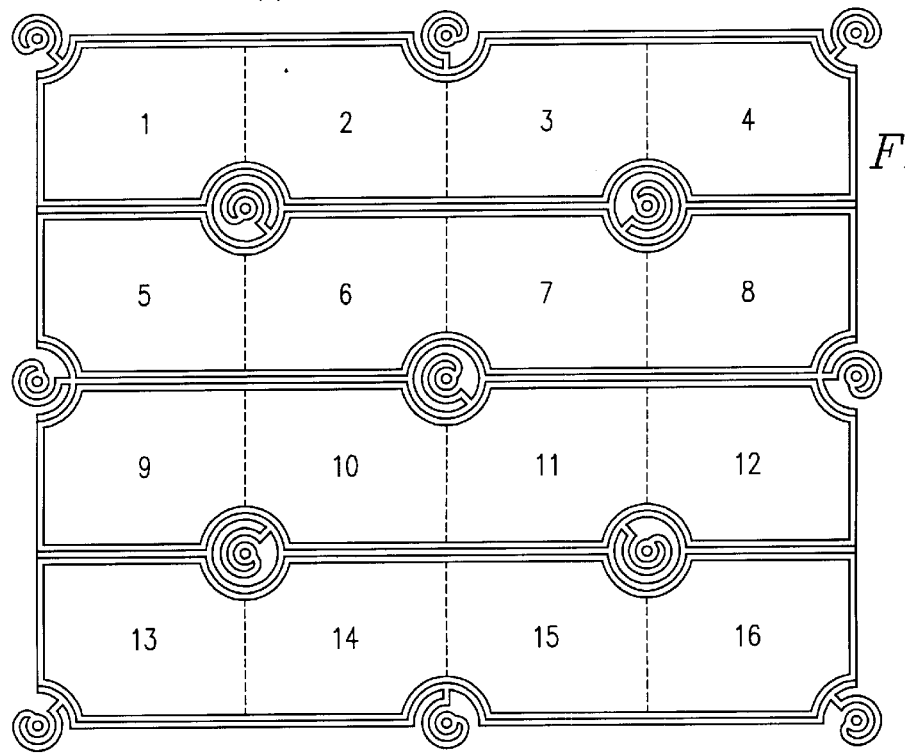
FIG. 14B is a schematic illustration of an array of spiral arm pixels connected electrically in parallel for large non-imaging arrays for maximized fill factor.

Referring to FIG. 11, an alternate embodiment of microbolometer 10 is illustrated and includes spiral arms 100. Spiral arms 100 are equivalent to electrode arms 14 as previously described. The spiral arm pixel configuration has utility both in imaging arrays and non-imaging arrays. It is the preferred configuration for non-imaging arrays because the spiral arm configuration provides a higher fill factor and provides a more stressed-tolerant microbolometer. In the spiral arm configuration the detector membrane may be essentially a continuous sheet with openings for the spiral arms with the membrane in contact to the substrate as illustrated in FIG. 14B. The electrode 70 (see FIG. 10) may have a thickness equal to the absorber 56 and therefore also contributes to the absorption IR energy. As shown in FIG. 14B there is an array of 16 spiral arm pixels connected electrically in parallel. The spiral arms and pixels of FIG. 14B are as described previously with reference to FIG. 11.

Figure 13C:
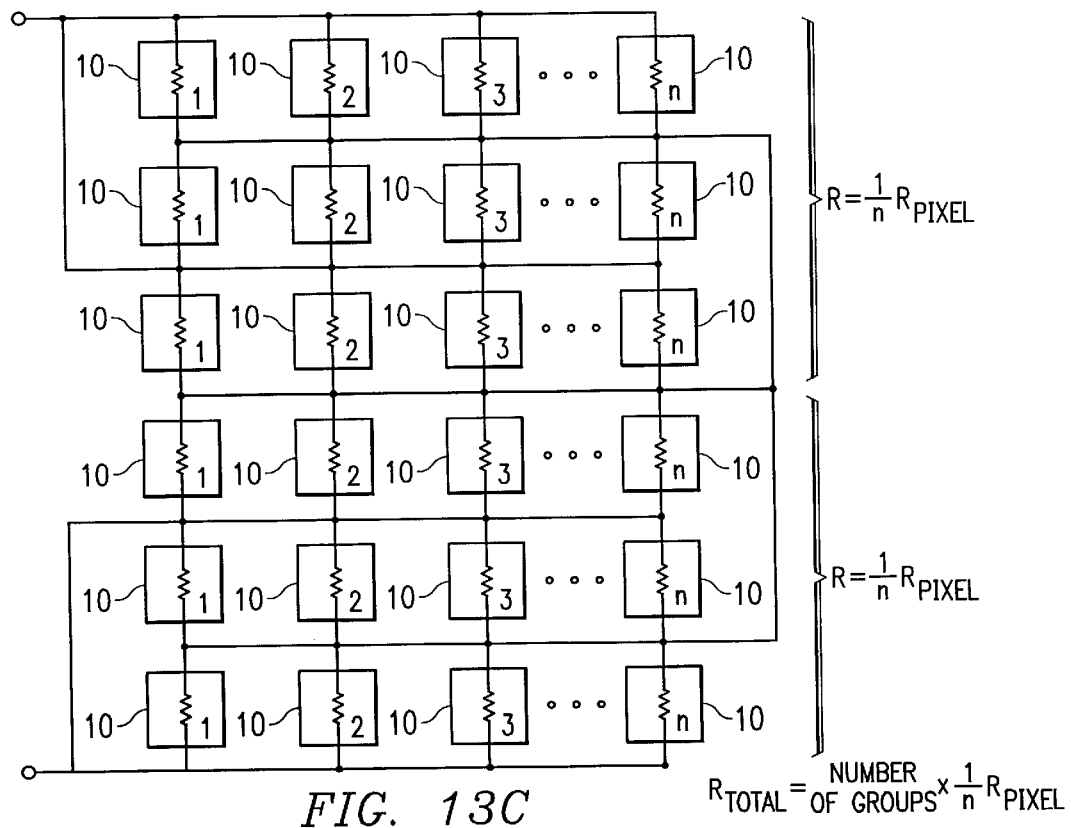
FIG. 13C schematically illustrates an electrical series-parallel configuration of non-imaging pixels for a large array.

A spiral arm array such as illustrated in FIG. 14B may be configured in an electrically parallel connection as shown in FIG. 13A or in a series-parallel connection as illustrated in FIGS. 13B and 13C. The spiral arm design may also have an IR shield deposition on the upper surface to form reference pixels as previously described. Further, the spiral arm configuration may have metal deposition as a thermal shunt on the spiral arm as previously described for the electrode arm 14. For an imaging array configuration the spiral arm design provides a larger detector for a given surface area (higher fill factor) on a substrate and provides a more stress-tolerant microbolometer. Spiral arms 100 are formed using the same process as electrode arms 14 as earlier described.

Figure 15:
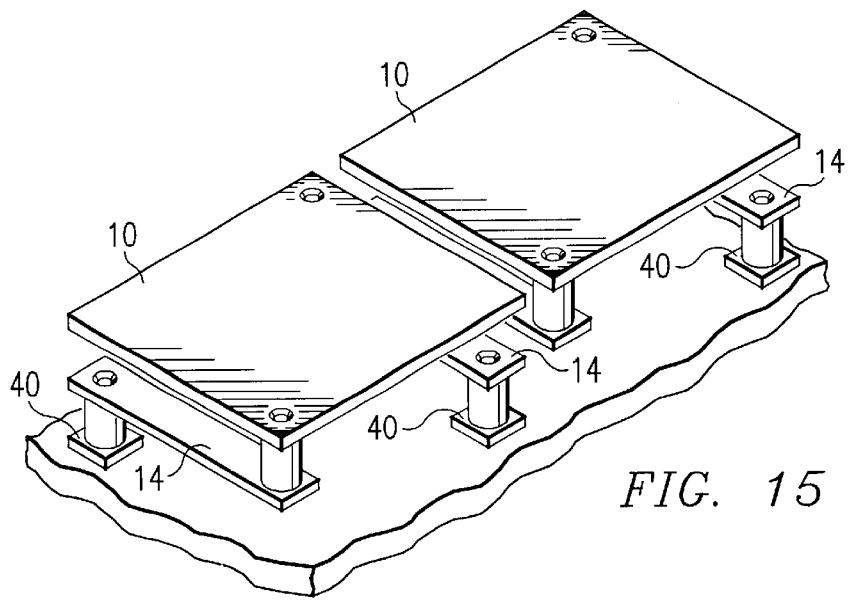
FIG. 15 illustrates another embodiment of a microbolometer formed in accordance with the present invention for maximizing the fill factor and minimizing space between adjacent microbolometers.

Referring to FIG. 15, there is illustrated an embodiment of the invention having electrode arms 14 formed between the substrate 11 (not shown in FIG. 15) and a bolometer 10. This provides the technical advantage of a maximized fill factor since a relatively small absorbing surface area is sacrificed for supporting arms and spaced between adjacent pixels. In the embodiment of FIG. 15 the electrode arm 14 (only one shown) is spaced below the bolometer 10 with the connection pads 40 on the surface of the supporting substrate as illustrated in FIGS. 1 and 2.

Figure 12:
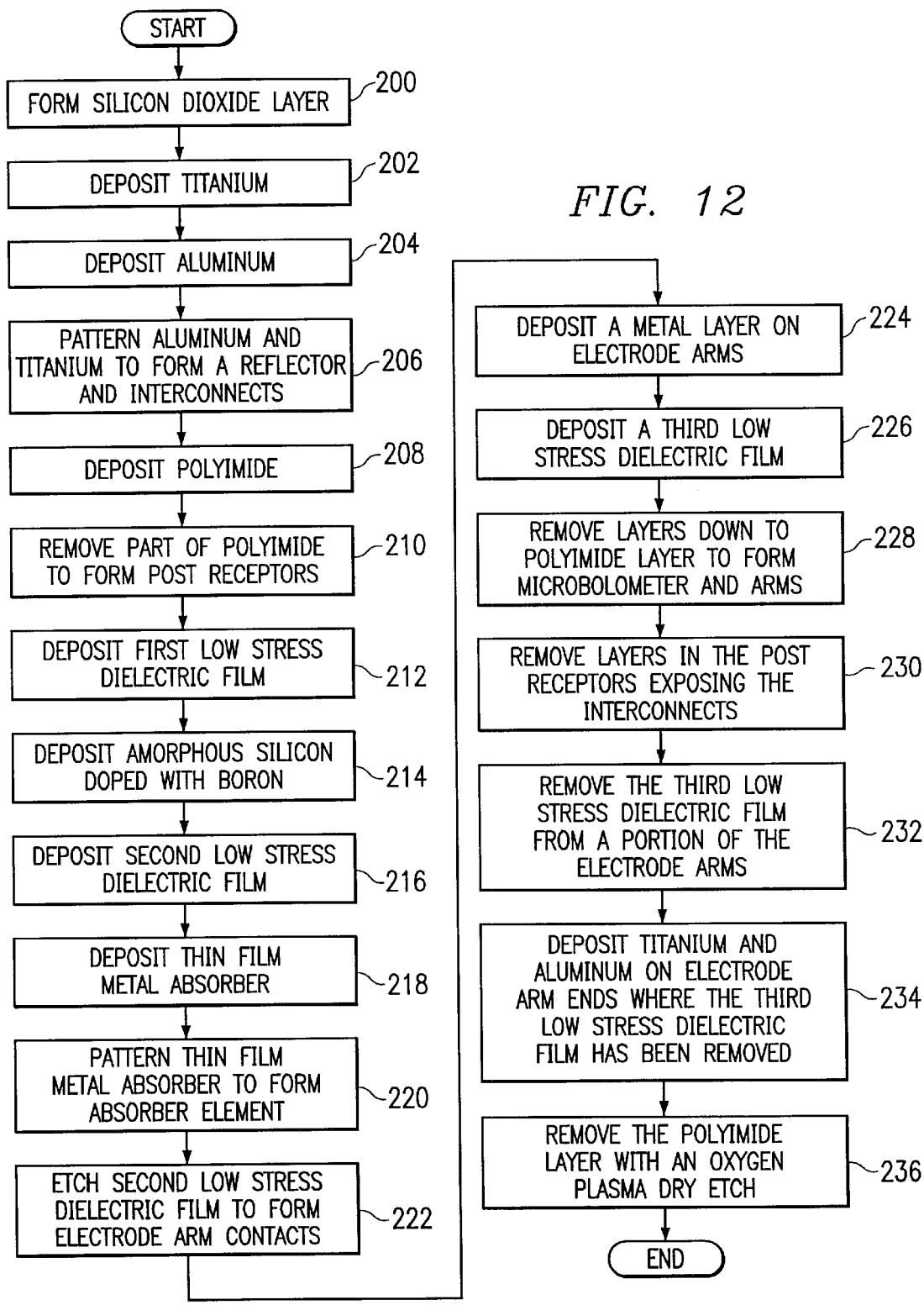
FIG. 12 is a flow diagram illustrating the formation of the microbolometer of the present invention.

Referring to FIG. 12, a flow diagram summarizing the formation of microbolometer 10 in accordance with the present invention is illustrated. The method begins at step 200 where silicon dioxide layer 30 is formed on substrate 11. The method proceeds to step 202 where titanium layer 32 is deposited on silicon dioxide layer 30. The method proceeds to step 204 where aluminum layer 34 is deposited on titanium layer 32. The method proceeds to step 206 where titanium layer 32 and aluminum layer 34 are patterned using a photoresist and etch process to form connection pads 40 and reflector 20.

The method proceeds to step 208 where polyimide layer 36 is deposited over the entire structure to a depth on the order of one-quarter wave length of the infrared radiation to be detected. The method proceeds to step 210 where post receptors 38 are formed by removing a portion of polyimide layer 36 thereby exposing connection pads 40. The method proceeds to step 212 where the first low stress dielectric film 50 is formed on the surface of the existing structure. The method proceeds to step 214 where amorphous silicon layer 52 is formed on first low stress dielectric film 50.

The method proceeds to step 216 where second low stress dielectric film 54 is deposited on amorphous silicon layer 52. The method proceeds to step 218 where a thin metal absorber film 56 is deposited on second low stress dielectric film 54. The method proceeds to step 220 where thin metal absorber film 56 is patterned leaving absorber 56.

The method proceeds to step 222 where second low stress dielectric film 54 is patterned with openings etched to expose portions of the outer surface of amorphous silicon layer 52 to define electrode arm channels 60. The method proceeds to step 224 where thin electrode metal layer 70 is deposited in electrode arm channels 60.

The method proceeds to step 226 where a third low stress dielectric film 72 is deposited on the surface of the structure. The method proceeds to step 228 where a photoresist and etch technique is used to pattern the structure to form microbolometer 10 by removing previously deposited layers down to polyimide layer 36. The method proceeds to step 230 where post receptors 38 are formed by removing previously deposited layers thereby exposing connection pads 40.

The method proceeds to step 232 where third low stress dielectric film 72 is removed from electrode arms 14 in the area to receive post 80 and thermal shunt 18. The method proceeds to step 234 where titanium layer 82 and aluminum layer 84 are formed and patterned leaving thin titanium layer 82 and aluminum layer 84 in post receptor 38 and on electrode terminal end 15. The method proceeds to step 236 where polyimide layer 36 is removed by exposing the structure to an oxygen plasma dry etch. At the conclusion of step 236, microbolometer 10 is complete and suspended above reflector 22 by electrode arms 14 and posts 16.

Although the present invention and its advantages have been described in detail, it should be understood that various changes, substitutions, and alterations readily apparent to those skilled in the art may be made without departing from the spirit and the scope of the present invention as defined by the following claims.

What is claimed is:

1. A microstructure infrared radiation detector, comprising:
   an absorber element having material properties to change temperature in response to absorbing infrared radiation;
   an amorphous silicon detector thermally coupled to the absorber element and suspended above a silicon substrate at a height of one-quarter wavelength of the infrared radiation to be detected, the amorphous silicon detector changing electrical resistance in response to the absorber element changing temperature;
   electrode arms coupled to the silicon substrate to suspend the amorphous silicon detector above the surface of the silicon substrate, the electrode arms further providing electrical connectivity for the microstructure infrared radiation detector; and
   a thermal shunting layer deposited on the electrode arms, the thermal shunting layer providing predetermined degrees of thermal isolation depending on the area of the thermal shunting layer.

2. The detector of claim 1, wherein the electrode arms comprise a spiral configuration providing reduced space requirements for the electrode arms.

3. A microstructure infrared radiation detector, comprising:
   a thin metal absorber film for absorbing heat when exposed to infrared radiation;
   an amorphous silicon layer thermally coupled to the thin metal absorber film, the amorphous silicon layer absorbing heat from the thin metal absorber layer, the amorphous silicon layer changing electrical resistance in response to absorbing heat from the thin metal absorber layer;
   electrode arms coupled to the amorphous silicon layer;
   an antireflective structure between a substrate material and the amorphous silicon layer, the antireflective structure enhancing absorption of the infrared radiation by the thin metal absorber film; and
   a thermal shunting layer deposited on the electrode arms, the thermal shunting layer providing predetermined degrees of thermal isolation depending on the area of the thermal shunting layer.

4. The detector of claim 3, further comprising:
   the electrode arms coupled to the amorphous silicon layer and to a silicon substrate, the electrode arms suspending the amorphous silicon layer above the surface of the silicon substrate.

5. The detector of claim 4, wherein the electrode arms comprise a spiral configuration providing reduced space requirements for the electrode arms.

6. A process for fabricating a micro-sensor element for an infrared radiation detector, comprising:
   forming one or more connection pads and a reflector on a surface of a substrate;
   forming a sacrificial spacer layer over the connection pads and the reflector;
   forming a first low stress dielectric layer over the sacrificial spacer layer;
   forming a detector layer over the first low stress dielectric layer, the detector layer having an electrical resistance that varies with a temperature of the detector layer, the detector layer formed above the reflector;
   forming a second low stress dielectric layer over the detector layer;
   forming an infrared absorber over the second low stress dielectric layer, the infrared absorber changing temperature in response to infrared radiation, the infrared absorber thermally transmitting energy from the infrared radiation to the detector layer, the infrared absorber formed over the detector layer;
   forming electrode arms, the electrode arms providing electrical contact to the detector layer;
   forming a third low stress dielectric layer over the structure;
   forming post receptors in ends of the electrode arms by removing layers thereby exposing the connection pads;
   forming a thermal shunting layer on the electrode arms;
   forming posts in the post receptors; and
   removing the sacrificial spacer layer.

7. The process according to claim 6, wherein forming one or more connection pads, comprises:
   depositing a layer of aluminum; and
   patterning the aluminum layer to form the one or more connection pads and the reflector.

8. The process according to claim 6, comprising:
   depositing a polyimide layer to form the sacrificial spacer layer.

9. The process according to claim 6, comprising:
   forming the sacrificial spacer layer to a depth of approximately one-quarter wavelength of the infrared radiation wavelength to be detected by the micro-sensor element.

10. The process according to claim 6, wherein forming, the first, second, and third low stress dielectric layers, comprises:
    depositing a silicon nitride layer.

11. The process according to claim 6, comprising:
    depositing an amorphous silicon layer to form the detector layer, the amorphous silicon layer doped with boron during deposition.

12. The process according to claim 6, comprising:
    depositing a thick layer of aluminum in the post receptors.

13. The process according to claim 6, wherein removing the sacrificial spacer layer, comprises:
    exposing the sacrificial layer to a dry etch to remove the sacrificial spacer layer.

14. The process according to claim 6, wherein removing the sacrificial spacer layer, comprises:
    exposing the sacrificial layer to an oxygen plasma dry etch to remove the sacrificial spacer layer.

15. A process for fabricating a micro-sensor element for an infrared radiation detector element, comprising:
    depositing a titanium layer on a surface of a silicon substrate wafer;
    depositing an aluminum layer over the titanium layer;
    patterning the aluminum and titanium layers to form a reflector element and a plurality of interconnects;
    depositing a polyimide layer over the patterned aluminum and titanium layers, the polyimide layer having a depth of approximately one-quarter wavelength of the infrared radiation wavelength to be detected by the micro-sensor element;
    removing a portion of the polyimide layer to form post receptors to receive aluminum posts for supporting the micro-sensor element above the reflector element and for providing electrical contact between the micro-sensor element and the interconnects;
    depositing a first low stress dielectric layer over the polyimide layer;
    depositing an amorphous silicon layer over the first low stress dielectric layer, the amorphous silicon layer doped with boron during deposition;
    depositing a second low stress dielectric layer over the amorphous silicon layer;
    depositing a thin film metal absorber layer over the second low stress dielectric layer;
    patterning the thin film metal absorber layer to form an absorber element over the reflector element;
    etching the second low stress dielectric layer to form electrode arms leaving amorphous silicon exposed in an area defined by the electrode arms;
    forming a metal layer on the electrode arms;
    depositing a third low stress dielectric layer over the structure;
    removing layers down to the polyimide layer to form the micro-sensor element in the area surrounding the electrode arms and the absorber element;
    removing the third low stress dielectric layer from a portion of the electrode arm ends;
    depositing a titanium layer in post receptors and on the electrode arm ends where the third low stress dielectric layer has been removed;
    depositing an aluminum layer over the titanium layer in post receptors and on the electrode arm ends; and
    removing the polyimide layer by exposing the micro-sensor element to an oxygen plasma dry etch.

16. The process according to claim 15, further comprising:
    an initial step of forming a layer of silicon dioxide on the surface of the silicon substrate wafer.

17. The process according to claim 15, wherein the first, second, and third low stress dielectric layers are formed by depositing a layer of silicon nitride.

18. An infrared radiation detector, comprising:
    a first plurality of micro-structure infrared radiation detectors, each detector comprising:
      a thin metal absorber film for absorbing heat when exposed to infrared radiation;
      an amorphous silicon layer thermally coupled to the thin metal absorber film, the amorphous silicon layer absorbing heat from the thin metal absorber film, the amorphous silicon layer changing electrical resistance in response to absorbing heat from the thin metal absorber film;
      an anti-reflective structure between a substrate material and the amorphous silicon layer, the anti-reflective structure enhancing absorption of the infrared radiation by the thin metal absorber film;
      electrode arms coupled to the amorphous silicon layer and to a silicon substrate, the electrode arms suspending the amorphous silicon layer above the surface of the silicon substrate;
    electrical conductors interconnecting the plurality of radiation detectors electrically in parallel as an array configuration functioning as a single detector;
    a second plurality of micro-structure infrared radiation detectors, each radiation detector of the second plurality similar to the first plurality of radiation detectors;
    electrical conductors interconnecting the second plurality of radiation detectors electrically in parallel as an array configuration; and
    electrical conductors interconnecting individual radiation detectors of the second plurality electrically in series with a corresponding one of the radiation detectors of the first plurality.

19. The detector as set forth in claim 18, wherein the electrode arms comprise a spiral configuration providing reduced space requirements for the electrode arms.

20. A microstructure infrared radiation detector, comprising:
    an absorber element having material properties to change temperature in response to absorbing infrared radiation;
    an amorphous silicon detector thermally coupled to the absorber element and suspended above a silicon substrate thereby forming an open space between the amorphous silicon detector and the silicon substrate, the amorphous silicon detector changing electrical resistance in response to the absorber element changing temperature;
    electrode arms positioned in the open space between the amorphous silicon detector and the silicon substrate and coupled to the silicon substrate and the amorphous silicon detector to suspend the amorphous silicon detector above the surface of the silicon substrate, the electrode arms further providing electrical connectivity for the microstructure infrared radiation detector; and
    a thermal shunting layer deposited on the electrode arms, the thermal shunting layer providing predetermined degrees of thermal isolation depending on the area of the thermal shunting layer.

21. The detector of claim 20, further comprising:
an antireflective structure between the silicon substrate and the amorphous silicon detector, the antireflective structure enhancing absorption of the infrared radiation by the absorber element.

22. A microstructure infrared radiation detector, comprising:
an absorber element having material properties to change temperature in response to absorbing infrared radiation;
an amorphous silicon detector thermally coupled to the absorber element and suspended above a silicon substrate, the amorphous silicon detector changing electrical resistance in response to the absorber element changing temperature;
electrode arms positioned between the silicon detector and the silicon substrate, the electrode arms coupled to the silicon substrate to suspend the amorphous silicon detector above the surface of the silicon substrate, the electrode arms further providing electrical connectivity for the microstructure infrared radiation detector; and
a thermal shunting layer deposited on the electrode arms, the thermal shunting layer providing predetermined degrees of thermal isolation depending on the area of the thermal shunting layer.

23. A process for fabricating a micro-sensor element for an infrared radiation detector, comprising:
forming one or more connection pads and a reflector on a surface of a substrate;
forming a sacrificial spacer layer over the connection pads and the reflector;
forming a first low stress dielectric layer over the sacrificial spacer layer;
forming a detector layer over the first low stress dielectric layer, the detector layer having an electrical resistance that varies with the temperature of the detector layer, the detector layer formed directly over the reflector;
forming a second low stress dielectric layer over the detector layer;
forming an infrared absorber over the second low stress dielectric layer, the infrared absorber changing temperature in response to infrared radiation, the infrared absorber thermally transmitting energy from the infrared radiation to the detector layer, the infrared absorber formed directly over the detector layer;
forming electrode arms, the electrode arms providing electrical contact to the detector layer;
forming a third low stress dielectric layer over the structure;
forming post receptors in the ends of the electrode arms by removing layers thereby exposing the connection pads;
forming posts in the post receptors; and
removing the sacrificial spacer layer.

24. The process of claim 23, wherein forming one or more connection pads comprises:
depositing a layer of aluminum; and
patterning the aluminum layer to form the one or more connection pads and the reflector.

25. The process according to claim 23, wherein forming a sacrificial spacer layer comprises:
depositing a polyimide layer to form the sacrificial spacer layer.

26. The process according to claim 23, wherein forming electrode arms, comprises:
depositing an electrode metal layer.

27. A process for fabricating a micro-sensor element for an infrared radiation detector, comprising:
forming one or more connection pads and a reflector on a surface of a substrate;
forming a sacrificial spacer layer over the connection pads and the reflector;
forming a first low stress dielectric layer over the sacrificial spacer layer;
forming a detector layer over the first low stress dielectric layer, the detector layer having an electrical resistance that varies with a temperature of the detector layer, the detector layer formed above the reflector;
forming a second low stress dielectric layer over the detector layer;
patterning the second low stress dielectric layer to form openings defining electrode arms;
forming electrode arms in the patterned second low stress dielectric layer and an infrared absorber over the patterned second low stress dielectric layer, the electrode arms providing electrical contact to the detector layer, the infrared absorber changing temperature in response to absorbed infrared radiation, the infrared absorber thermally transmitting energy from the infrared radiation to the detector layer;
forming a third low stress dielectric layer over the structure;
removing the third low stress dielectric layer in ends of the electrode arms and removing the third low stress dielectric layer, the second low stress dielectric layer, the detector layer, and first low stress dielectric layer thereby to expose the connection pads to form post receptors, and also exposing the sacrificial spacer layer to form the micro-sensor element in the area surrounding the electrode arms and the absorber element;
forming a thermal shunting layer on the electrode arms;
forming posts in the post receptors; and
removing the sacrificial spacer layer.

28. The process according to claim 27, wherein forming one or more connection pads, comprising:
depositing a layer of aluminum; and
patterning the aluminum layer to form the one or more connection pads and the reflector.

29. The process according to claim 27 comprising:
forming the sacrificial spacer layer to a depth of approximately one-quarter wavelength of the infrared radiation wavelength to be detected by the micro-sensor element.

30. A process for fabricating a micro-sensor element for an infrared radiation detector, comprising:
depositing a first metal layer on a surface of a silicon substrate wafer;
depositing a second metal layer over the first metal layer;
patterning the first and second metal layers to form a reflector element and a plurality of interconnects;
depositing a polyimide layer over the patterned first and second layers, the polyimide layer having a depth of approximately one-quarter wavelength of the infrared radiation wavelength to be detected by the micro-sensor element;
removing a portion of the polyimide layer to form post receptors to receive metal posts for supporting the micro-sensor element above the reflector element and for providing electrical contact between the micro-sensor element and the interconnects;

depositing a first low stress dielectric layer over the polyimide layer;

depositing an amorphous silicon layer over the first low stress dielectric layer, the amorphous silicon layer doped with boron during deposition;

depositing a second low stress dielectric layer over the amorphous silicon layer;

patterning the second low stress dielectric layer to form openings defining electrode arms;

depositing a thin film metal absorber layer over the patterned second low stress dielectric layer;

patterning the thin film metal absorber layer to form an absorber element and electrode arms;

depositing a third low stress dielectric layer over the structure;

removing the third low stress dielectric layer from a portion of the electrode arm ends and removing layers down to the post receptors and down to the polyimide layer to form the micro-sensor element in the area surrounding the electrode arms and the absorber element;

depositing a third metal layer on the electrode arm ends where the third low stress dielectric layer has been removed and in post receptors;

depositing a fourth metal layer over the third metal layer on the electrode arm ends and in post receptors; and removing the polyimide layer by an oxygen plasma dry etch.

31. The process according to claim 30, further comprising:

an initial step of forming a layer of silicon dioxide on the surface of the silicon substrate wafer.

32. An infrared radiation detector, comprising:

a plurality of microstructure infrared radiation detectors, each detector comprising:

a thin metal absorber film for absorbing heat when exposed to infrared radiation;

an amorphous silicon layer thermally coupled to the think metal absorber film, the amorphous silicon layer absorbing heat from the think metal absorber layer, the amorphous silicon layer changing electrical resistance in response to absorbing heat from the thin metal absorber layer;

an anti-reflective structure between a substrate material and the amorphous silicon layer, the anti-reflective structure enhancing absorption of the infrared radiation by the thin metal absorber film;

electrode arms coupled to the amorphous silicon layer and to a silicon substrate, the electrode arms suspending the amorphous silicon layer above the surface of the silicon substrate; and an infrared shield deposited on selected one of the plurality of infrared detectors to provide non-responsive reference detectors.

33. A process for fabricating a micro-sensor element for an infrared radiation detector, comprising:

forming one or more connection pads and a reflector on a surface of a substrate;

forming a sacrificial space layer over the connection pads and the reflector;

forming a first low stress dielectric layer over the sacrificial space layer;

forming a detector layer over the first low stress dielectric layer, the detector layer having an electrical resistance that varies with the temperature of the detector layer, the detector layer formed directly over the reflector;

forming a second low stress dielectric layer over the detector layer;

patterning the second low stress dielectric layer to form openings defining electrode arms;

forming electrode arms in the patterned second low stress dielectric layer, the electrode arms providing electrical contact to the detector layer, and an infrared absorber over the second low stress dielectric layer, the infrared absorber changing temperature in response to absorbed infrared radiation, the infrared thermally transmitting energy from the infrared radiation to the detector layer;

forming a third low stress dielectric layer over the structure;

removing third low stress dielectric layer in ends of the electrode arms and removing the third low stress dielectric layer, the second low stress dielectric layer, the detector layer, and first low stress dielectric layer to expose the connection pads to form post receptors, and also exposing the sacrificial spacer layer to form the micro-sensor element in the area surrounding the electrode arms and the absorber element;

forming posts in the post receptors; and removing the sacrificial spacer layer.

34. The process of claim 33, wherein forming one or more connection pads comprises:

depositing a layer of aluminum; and patterning the aluminum layer to form the one or more connection pads and the reflector.

35. The process according to claim 33 further comprising forming an infrared shield on third low stress dielectric layer.

36. A process for fabricating a micro-sensor element for an infrared radiation detector, comprising:

forming one or more connection pads and a reflector on a surface of a substrate;

forming a sacrificial spacer layer over the connection pads and the reflector;

forming a first low stress dielectric layer over the sacrificial spacer layer;

forming a detector layer over the first low stress dielectric layer, the detector layer having an electrical resistance that varies with the temperatures of the detector layer, the detector layer formed directly over the reflector;

forming a second low stress dielectric layer over the detector layer;

removing the second low stress dielectric layer, the detector layer, and first low stress dielectric layer thereby exposing the connection pads to form post receptors;

patterning the second low stress dielectric layer to form openings defining electrode arms;

forming electrode arms in the patterned second low stress dielectric layer, the electrode arms providing electrical contact to the detector layer, and an infrared absorber over the second low stress dielectric layer, the infrared absorber changing temperature in response to absorbed infrared radiation, the infrared absorber thermally energy from the infrared radiation to the dielectric layer;

forming posts in the post receptors connecting electrode arm ends to connection pads;

forming a third low stress dielectric layer over the structure;

removing the third low stress dielectric layer, the second low stress dielectric layer, the detector layer, and first low stress dielectric layer exposing the sacrificial spacer layer to form the micro-sensor element in the area surrounding the electrode arms and the absorber element; and removing the sacrificial spacer layer.

37. The process according to claim 36 further comprising forming an infrared shield on third low stress dielectric layer.

38. The process according to claim 36 wherein prior to patterning the second low stress dielectric layer to form openings defining electrode arms further comprising removing the second low stress dielectric layer, the detector layer, and first low stress dielectric layer to expose the connection pads to form the post receptors.

* * * * *

UNITED STATES PATENT AND TRADEMARK OFFICE
CERTIFICATE OF CORRECTION

PATENT NO.        : 6,690,014 B1                                        Page 1 of 1
APPLICATION NO.   : 09/557748
DATED             : February 10, 2004
INVENTOR(S)       : Gooch et al.

It is certified that error appears in the above-identified patent and that said Letters Patent is hereby corrected as shown below:

Column 3
line 34, no new paragraph starting with "Substrate 11"; and
line 58, after "arms 14." start a new paragraph with "The thermal".
Column 6
line 42, change "bolometer" to --microbolometer--.
Column 11
line 5 (Claim 10), after "forming" delete the comma.
Column 13
line 33 (Claim 23), change "dielectric layer" to --dielectric film--;
line 42 (Claim 23), change "dielectric layer," to --dielectric film,--; and
line 49 (Claim 23), change "dielectric layer" --dielectric film--.
Column 14
line 42 (Claim 28), after "pads" delete "comprising" and insert --comprises--; and
line 58 (Claim 30), after "second" insert --metal--.
Column 15
line 42 (Claim 32), change "think metal" to --thin metal--;
line 43 (Claim 32), change "think metal" to --thin metal--;
line 55 (Claim 32), change "selected one" to --selected ones--;
line 62 (Claim 33), change "sacrificial space" to --sacrificial spacer--; and
lines 64-65 (Claim 33), change "sacrificial space" to --sacrificial spacer--.
Column 16
line 10 (Claim 33), between "dielectric" and "layer," insert --film--;
line 14 (Claim 33), between "infrared" and "thermally" insert --absorber--;
line 46 (Claim 36), change "the temperatures" to --the temperature--;
lines 60-61 (Claim 36), between "thermally" and "energy" insert --transmitting--; and
line 61 (Claim 36), change "dielectric" to --detector--.

Signed and Sealed this

Thirty-first Day of October, 2006

JON W. DUDAS
*Director of the United States Patent and Trademark Office*